(12) United States Patent
Lee et al.

(10) Patent No.: US 8,052,499 B2
(45) Date of Patent: Nov. 8, 2011

(54) ORGANIC ELECTROLUMINESCENCE DEVICE AND MANUFACTURING METHOD THEREOF

(75) Inventors: Jong-Hyuk Lee, Yongin-si (KR);
Yoon-Hyeung Cho, Yongin-si (KR);
Hyun-Jung Yang, Yongin-si (KR);
Won-Jong Kim, Seoul (KR);
Hae-Seung Lee, Seoul (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/825,442

(22) Filed: Jun. 29, 2010

(65) Prior Publication Data

US 2010/0264815 A1    Oct. 21, 2010

Related U.S. Application Data

(62) Division of application No. 11/085,258, filed on Mar. 22, 2005, now Pat. No. 7,834,540.

(30) Foreign Application Priority Data

Apr. 6, 2004    (KR) .................. 10-2004-0023335

(51) Int. Cl.
*H01J 9/00* (2006.01)
*H01J 1/62* (2006.01)

(52) U.S. Cl. ................... 445/24; 313/504; 313/506

(58) Field of Classification Search ............. 445/24, 445/25

See application file for complete search history.

(56) References Cited

U.S. PATENT DOCUMENTS

| | | | |
|---|---|---|---|
| 5,882,761 A | 3/1999 | Kawami et al. | |
| 5,888,367 A | 3/1999 | Mouri et al. | |
| 2001/0046579 A1 | 11/2001 | Ishii et al. | |
| 2002/0015818 A1 | 2/2002 | Takahashi | |
| 2002/0057565 A1 | 5/2002 | Seo | |
| 2002/0063515 A1 | 5/2002 | Goto | |
| 2002/0146533 A1 | 10/2002 | Chung et al. | |
| 2002/0155320 A1 | 10/2002 | Park | |
| 2002/0183431 A1 | 12/2002 | Kawaguchi et al. | |
| 2002/0197511 A1 | 12/2002 | D'Andrade et al. | |
| 2003/0037677 A1 | 2/2003 | Boroson et al. | |
| 2003/0170496 A1 | 9/2003 | Hieda et al. | |
| 2004/0135492 A1 | 7/2004 | Deguchi | |
| 2004/0149962 A1 | 8/2004 | Andriessen | |

FOREIGN PATENT DOCUMENTS

| | | |
|---|---|---|
| EP | 0 776 147 | 5/1997 |
| JP | 5124330 A | 5/1993 |
| JP | 09-148066 | 6/1997 |
| JP | 2002-216951 | 8/2002 |
| JP | 2002-280166 | 9/2002 |

OTHER PUBLICATIONS

Office action from the Chinese Patent Office issued in Applicant's corresponding Chinese Patent Application No. 200510069747.3 dated May 9, 2008. Office action from the Japanese Patent Office issued in Applicant's corresponding Japanese Patent Application No. 2004-244146 dated Feb. 26, 2008.
European Office action for European Patent Application No. 05 10 2633, issued on Feb. 13, 2006.
Registration Determination Certificate issued by Chinese Intellectual Property Office on Jun. 29, 2011, corresponding to Chinese Application No. 2005 1 0069747.3 and its English translation attached herewith.

*Primary Examiner* — Bumsuk Won
(74) *Attorney, Agent, or Firm* — Robert E. Bushnell, Esq.

(57) ABSTRACT

An organic electroluminescence (EL) device which has a rear substrate, an organic EL element formed on the rear substrate and having a laminate structure in which a first electrode, an organic layer and a second electrode are sequentially laminated, a front substrate coupled to the rear substrate via sealant to seal an internal space in which the organic EL element is accommodated, and a transparent nanoporous oxide layer having nanoporous oxide particles disposed in the internal space formed by the rear substrate and the front substrate. Since the organic electroluminescence device includes the transparent nanoporous oxide layer having the nanoporous oxide particles and pores, it has an improved lifetime by increased moisture and oxygen absorbing properties.

24 Claims, 6 Drawing Sheets

ORGANIC ELECTROLUMINESCENCE DEVICE AND MANUFACTURING METHOD THEREOF

CLAIM OF PRIORITY

This application claims the priority of Korean Patent Application No. 2004-23335, filed on Apr. 6, 2004, in the Korean Intellectual Property Office, the disclosure of which is incorporated herein in its entirety by reference. Furthermore, this application is a divisional of Applicants' Ser. No. 11/085,258 filed in the U.S. Patent & Trademark Office on 22 Mar. 2005, and assigned to the assignee of the present invention.

BACKGROUND OF THE INVENTION

1. Field of the Invention

The present invention relates to an organic electroluminescence device and a manufacturing method thereof, and more particularly, to an organic electroluminescence device which can be applied to a front emission type, a rear emission type or both, and has an improved lifetime by enhanced moisture and oxygen absorbing properties, and a manufacturing method thereof.

2. Description of the Related Art

Since an organic electroluminescence device tends to deteriorate due to infiltration of moisture, there arises a need for an encapsulation member for preventing moisture from infiltrating into the device.

Conventionally, there have been employed several encapsulating methods, including forming a cap-shaped metal can or glass which has a recess so that a powdered absorbent for absorbing moisture is accommodated therein, and forming a film-type double-sided tape for adhesion.

Several drawbacks with use of the conventional absorbent are that the process is complicated, the material and processing costs may increase, the overall thickness of a substrate may increase, and a non-transparent encapsulating substrate disables front emission to be achieved. Also, since etched glass used as the encapsulation member is so brittle that it is easily damaged due to external impacts. The film-type encapsulation member is limited in its capability of preventing moisture infiltration, and tears easily during fabrication or use. That is, the film-type encapsulation member is poor in durability and reliability, so that it cannot be suitably employed for mass production.

Japanese Patent Laid-open Publication No. Hei 9-148066 discloses an organic electroluminescence device comprising a laminate structure in which organic light-emitting material layers formed of organic compounds are disposed between a pair of opposed electrodes, a sealing vessel for preventing the laminate structure from being exposed to external air, and drying means, such as alkali metal oxide or alkali metal oxide, provided inside the sealing vessel. However, the organic electroluminescence device becomes bulky due to the shape of the sealing vessel. Also, even if the device is maintained at a solid state due to moisture absorption by the drying means, it cannot be employed for a front emission display due to opaqueness. Further, as mentioned above, this technique involves a complicated process, resulting in an increase in the material and processing costs.

SUMMARY OF THE INVENTION

It is therefore an object of the present invention to provide an improved organic electroluminescence (EL) device.

It is also an object of the present invention to provide an organic electroluminescence (EL) device which can be applied to front emission type electroluminescent element, and a manufacturing method thereof.

It is another object of the present invention to provide an organic electroluminescence (EL) device which has improved moisture and oxygen absorption property to have an improved lifetime.

The above and other objects are achieved by the present invention.

According to an aspect of the present invention, there is provided an organic electroluminescence device comprising a rear substrate, an organic EL element formed on a surface of the rear substrate and having a laminate structure in which a first electrode, an organic layer and a second electrode are sequentially laminated, a front substrate coupled to the rear substrate to seal an internal space in which the organic EL element is accommodated using a sealant, and a transparent nanoporous oxide layer having nanoporous oxide particles disposed in the internal space formed by the rear substrate and the front substrate.

According to another aspect of the present invention, there is provided a method of manufacturing an organic electroluminescence device comprising preparing a rear substrate having an organic EL element having a first electrode, an organic layer and a second electrode are sequentially laminated, forming a transparent nanoporous oxide layer in an internal space formed by the rear substrate and the front substrate, the transparent nanoporous oxide layer obtained by mixing the nanoporous oxide particles with a solvent and acid to give a sol-state composition, coating the sol-state mixture on the entire surface of the front substrate, and drying and heat-treating the same, coating a sealant on a peripheral portion of the organic EL element of at least one of the rear substrate and the front substrate, and coupling the rear substrate and the front substrate to each other.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

The present invention will now be described in more detail.

The organic electroluminescence device according to the present invention comprising a transparent porous oxide layer, preferably a transparent nanoporous oxide layer, which comprises porous oxide particles, preferably nanoporous oxide particles, absorbs oxygen and moisture very rapidly, exhibiting noticeable improvement in lifetime.

The transparent nanoporous oxide layer is formed by a colloidal sal-gel method. First, a colloidal sol is formed. The colloidal sol has oxide small oxide particles dispersed in a solvent so that dispersion stability is established due to electrostatic repulsion among the particles. Methods of dispersing the oxide particles in the solvent include, but are not limited to, dispersion by using electrostatic repulsion, and dispersion by using a polymeric additive for stabilizing dispersion. In the present invention, the dispersion by using electrostatic repulsion is preferred in order to attain a final nanoporous oxide layer having good physical properties.

In order to form the transparent nanoporous oxide layer according to the present invention, the following requirements must be satisfied. First, hard agglomerate should not be formed from solid particles. The sizes of the solid particles should be within the range in which no Reyleigh's scattering occurs within a dispersion-stabilized sol, ensuring transparency without haze. The "Reyleigh's scattering" refers to a phenomenon that blue color development is induced to a coating, when viewed from a black background, due to scattering in a short wavelength region. In order to meet the requirements, the porous oxide particles forming the sol must have an average diameter of not greater than 100 nm, preferably, not greater than 70 nm, and more preferably, being in a range of about 20 to about 60 nm. Likewise, pores resulting from coating must also have an average diameter of not greater than 100 nm, preferably, not greater than 70 nm, and more preferably, being in a range of about 20 to about 60 nm.

When a metal oxide layer is formed by a general polymer sal-gel method, a sol is obtained by hydrolysis of a metal alkoxide compound as a porous oxide precursor, dehydration of the hydrolyzed product, and polycondensation of the dehydrated product. The obtained sol is coated on a substrate, followed by heat treatment at high temperature of 500° C. or higher, thereby acquiring the metal oxide layer. The metal oxide layer obtained by high-temperature treatment may be presintered during the high-temperature treatment, giving a densified layer having necks formed among particles. However, because the porosity of the densified layer still is not enough so that the specific surface area enabling surface absorption is reduced, the densified layer is not enough to absorb moisture and oxygen.

Highly hygroscopic alkali metal-based oxide precursors, for example, calcium alkoxide, or barium alkoxide, have very high electro-positivity, so that they sharply react with moisture used for hydrolysis, undesirably producing macro-sized particles that are hard agglomerates.

In the present invention, nanoporous oxide particles are used as starting materials and dispersed in a solvent and acid to form a sol-state mixture exhibiting dispersion stability. Then, the mixture is coated, dried, and thermally heated at 250° C. or less, preferably at a temperature of about 100 to 200° C., thereby evaporating the solvent to form a transparent nanoporous oxide layer having a point of contact in each of the particles. The transparent nanoporous oxide layer has transparency owing to maximized hygroscopic efficiency by a large specific area resulting from porous oxide particles contained therein and nano-sized pores.

The transparent nanoporous oxide layer according to the present invention has pores formed preferably by contacts between each of the respective nano-sized particles. If the particles are connected to one another through neck formation caused by pre-sintering process performed during heat treatment, effective sites or surface area available for absorbing moisture vapor may be reduced.

Figure 1:
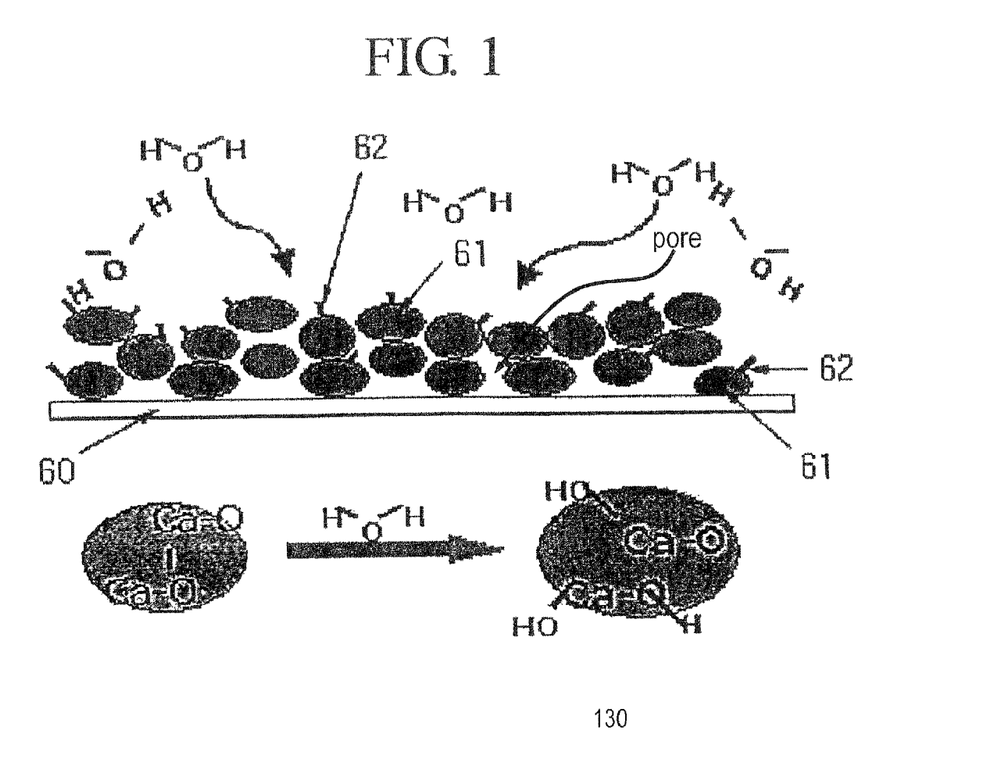
FIG. 1 is a diagram for explaining the moisture absorption mechanism of the transparent nanoporous CaO film according to a preferred embodiment of the present invention.

FIG. 1 is a schematic diagram of a transparent nanoporous oxide layer according to an embodiment of the present invention. Referring to FIG. 1, the moisture absorption mechanism will now be described.

As shown in FIG. 1, nano-sized CaO particles 61 contact one another on a substrate 60, and each particle has moisture absorption sites 62 positioned on its surface. For brevity, FIG. 1 shows that only one moisture absorption site is formed on the surface of a particle.

In the organic electroluminescence device according to the present invention, the transparent nanoporous oxide layer may be positioned within an internal space formed by a rear substrate and a front substrate. In particular, the transparent nanoporous oxide layer may also be formed on an inner surface of the front substrate (FIG. 2A), on a lateral surface of the sealant (FIG. 2B), or on at least one side of the rear substrate or the front substrate, for example, in the recess of the rear substrate (FIG. 2C).

Figure 2A:
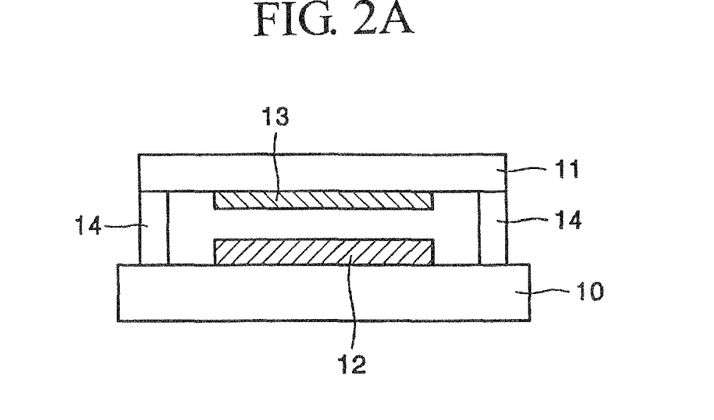
FIGS. 2A through 2C schematically illustrate an organic electroluminescence device according to the preferred embodiments of the present invention.

FIG. 2A is a schematic diagram of the organic electroluminescence device according to the present invention.

Referring to FIG. 2A, the organic electroluminescence device according to the present invention includes a rear substrate 10 made of glass or a transparent insulator, an organic EL element 12 formed on a surface of the rear substrate 10 and having a laminate structure in which a first electrode, an organic layer and a second electrode are sequentially laminated, and a front substrate 11 coupled to the rear substrate 10 and coated with a transparent nanoporous oxide layer 13 having nanoporous oxide particles disposed in the internal space and nano-sized pores to seal an internal space in which the organic EL element 12 is accommodated.

The front substrate 11 and the rear substrate 10 are coupled to each other by a sealant 14 coated on the outer periphery of the organic EL element 12. The front substrate 11 is also called an encapsulating substrate, and has a capability of sealing the organic EL element 12 disposed between the front substrate 11 and the rear substrate 10 in corporation with the rear substrate 10. The front substrate 11 may take form of an encapsulating substrate. A front substrate 21, 31 shown in FIGS. 2B, 2C may also act as an encapsulating substrate like the front substrate 11 shown in FIG. 2A.

Figure 2B:
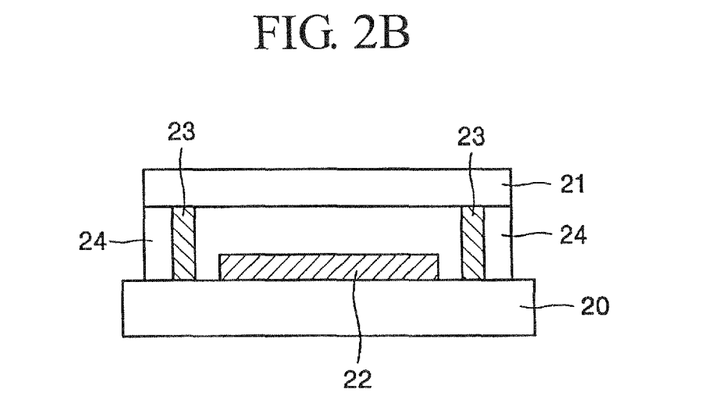
Figure 2C:
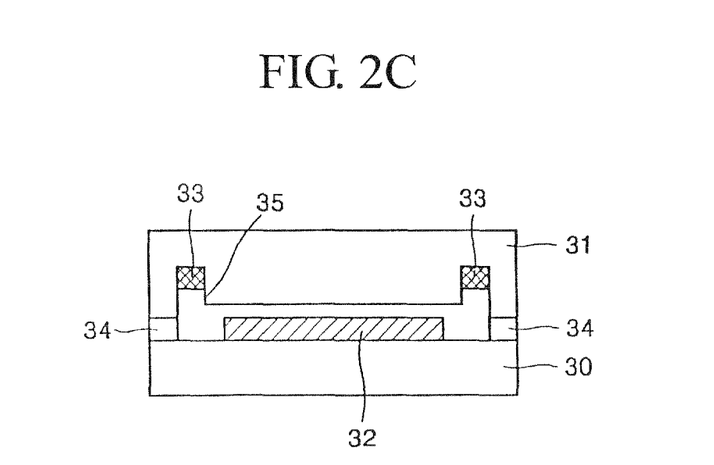

Referring to FIG. 2B, the organic electroluminescence device according to the present invention includes a transparent nanoporous oxide layer 23 formed on the lateral surface of the sealant 24.

Referring to FIG. 2C, the organic electroluminescence device according to the present invention has a recess 35 formed on one surface of the front substrate 31, that is, an encapsulating substrate, sealed with the rear substrate 30 to form an internal space, and a transparent nanoporous oxide layer 33 is formed in the recess 35.

The transparent nanoporous oxide layer 13, 23, 33 is preferably formed of a transparent nanoporous CaO film.

The organic EL element 12, 22, 32 may be formed by deposition. The organic EL element 12, 22, 32 may have a first electrode, an organic layer, and second electrode sequentially laminated in that order. The first electrode can be a cathode and the second electrode can be an anode. Also, the organic layer may include a hole injection layer, a hole transport layer, an emission layer, an electron injection layer and/ or an electron transport layer.

A substrate made of an insulating material, such as glass or plastic, may be used as the front substrate 11, 21, 31. In the case of using a plastic substrate, the inner surface of the plastic substrate may further include a protection layer for protecting the substrate against moisture. The protection layer has heat resistance, chemical resistance and moisture resistance. In this manner, in a case where the front substrate is formed of a transparent material, it can be advantageously used for a front emission type display.

In order to be used for a rear emission type display, the organic EL element 12, 22, 32 may be configured such that its first electrode is of a transparent type and its second electrode is of a reflective type. In order to be used for a front emission type display, the organic EL element 12, 22, 32 may be configured such that its first electrode is of a reflective type and its second electrode is of a transparent type. The first electrode is an electrode disposed close to the rear substrate 10, 20, 30, and the second electrode is an electrode disposed close to the front substrate 11, 21, 31.

In order to impart heat resistance, chemical resistance and moisture resistance to the top surface of the second electrode, the organic EL element 12, 22, 32 may further include a protection layer made of an inorganic material to make the top surface even. Specifically, the protection layer may be formed of metal oxide or metal nitride.

According to the present invention, the internal space defined by the front substrate 11, 21, 31 and the rear substrate 10, 20, 30 is maintained vacuous or filled with inert gas.

With a proviso that appropriate transparency is ensured, the thicker the transparent nanoporous oxide layer 13, 23, 33 is, the more advantageous it is. Preferably, the thickness of the transparent nanoporous oxide layer 13, 23, 33 is in a range of 0.1 to 12 µm. If the thickness of the porous oxide layer 13 is less than 0.1 µm, the moisture-absorbing property of the layer is not high enough. If the thickness of the porous oxide layer 13 is greater than 12 µm, the pore size may become larger than the size of an oxide particle, making the oxide layer contact the organic EL element and undesirably increasing an area vulnerable to moisture penetration.

As the material for forming the transparent nanoporous oxide layer, at least a material having an average particle diameter of not greater than 100 nm, preferably, 20 to 100 nm, the material selected from the consisting of alkali metal oxide, alkali earth metal oxide, metal halide, metal sulfate and metal perchlorate.

Examples of the alkali metal oxide include lithium oxide ($Li_2O$), sodium oxide ($Na_2O$), and potassium oxide ($K_2O$). Examples of the alkali earth metal oxide include barium oxide (BaO), calcium oxide (CaO), and magnesium oxide (MgO). Examples of the metal sulfate include lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate ($NiSO_4$). Examples of the metal halide include calcium chloride ($CaCl_2$), magnesium chloride ($MgCl_2$), strontium chloride ($SrCl_2$), yttrium chloride ($YCl_2$), copper chloride ($CuCl_2$), cesium fluoride (CsF), tantalum fluoride ($TaF_5$), niobium fluoride ($NbF_5$), lithium bromide (LiBr), calcium bromide ($CaBr_3$), cerium bromide ($CeBr_4$), selenium bromide ($SeBr_2$), vanadium bromide ($VBr_2$), magnesium bromide ($MgBr_2$), barium iodide ($BaI_2$) and magnesium iodide ($MgI_2$). Examples of the metal perchlorate is barium perchlorate ($Ba(ClO_4)_2$) or magnesium perchlorate ($Mg(ClO_4)_2$).

A method for forming the organic electroluminescence device having the above-described transparent nanoporous oxide layer will now be described.

First, a rear substrate is prepared, the rear substrate on which an organic EL element having a laminate structure in which a first electrode, an organic layer and a second electrode are sequentially laminated is formed. Then, nanoporous oxide particles were mixed with a solvent and acid to give a sol-state composition for forming a transparent nanoporous oxide layer.

The composition was coated on the inner surface of the front substrate, followed by drying and performing heat treatment, thereby obtaining the transparent nanoporous oxide layer.

The heat treatment is preferably performed at a temperature of not greater than 250° C., more preferably 100 to 200° C. If the temperature of the heat treatment is greater than 250° C., a specific surface area may decrease due to presintered particles, thereby lowering a moisture-absorbing property.

Mixing the nanoporous oxide particles with a solvent and acid is preferably performed in the following order in terms of dispersion efficiency.

That is, the solvent and acid were added to adjust pH to be in a range of 1 to 8, preferably about 2, and the nanoporous oxide particles are then added thereto. Here, adding the acid is optional.

Methods of coating the composition on the inner surface of the front substrate are not particularly limited, and usable examples of the method include spin coating, spray coating, deep coating, dispensing, printing and so on.

The acid may be optionally added in order to increase dispersion efficiency. Examples of the acid useful in the present invention include nitric acid, hydrochloric acid, sulfuric acid and acetic acid. The acid is preferably added in an amount of 0.01 to 0.1 parts by weight, based on 100 parts by weight of the nanoporous oxide particles.

Any solvent that is capable of dispersing the nanoporous oxide particles can be used and specific examples thereof include ethanol, methanol, propanol, butanol, isopropanol, methylethylketone, pure water, propyleneglycol (mono)methylether (PGM), isopropylcellulose (IPC), methylene chloride (MC), and ethylene carbonate (EC). The solvent is preferably used in an amount of 60 to 99 parts by weight and the acid in an amount of 0.01 to 0.1 parts by weight, based on 100 parts by weight of the nanoporous oxide particles.

The transparent nanoporous oxide layer according to the present invention is preferably a thin film having a thickness of about 0.1 to 12 µm, and has sufficiently high moisture and oxygen absorption properties, thereby exhibiting excellent encapsulation quality of the organic electroluminescence device.

After the front substrate having the transparent nanoporous oxide layer is prepared in the above-described manner, a sealant is coated on a peripheral portion of the organic EL element of at least one of the rear substrate and the front substrate using a screen printer or dispenser. Then, the rear substrate and the front substrate are coupled to each other via the sealant, thereby completing the organic EL device according to the present invention.

Alternatively, the internal space of the completed organic EL device according to the present invention may be made vacuous or filled with inert gas. Otherwise, after coupling the rear substrate and the front substrate to each other, the sealant may be cured using UV ray, visible light or heat.

The thus formed transparent nanoporous oxide layer has pores formed therein and is maintained at a transparent state before and after absorbing moisture.

The pores have an average diameter of not greater than 100 nm, preferably not greater than 70 nm, more preferably 20 to 60 nm. If the average diameter is greater than 100 nm, the layer may have poor moisture absorbing capability.

The organic electroluminescence device according to the present invention can be applied to a front emission type, a rear emission type, or both types.

The organic electroluminescence device according to the present invention is not particularly restricted in driving type, and both a passive matrix (PM) driving type and an active matrix (AM) driving type can be used.

Hereinafter, the present invention will now be described in more detail with reference to the following examples. However, the following examples are for illustrative purposes and are not intended to limit the scope of the invention.

EXAMPLE 1

To 95 g of ethanol was added nitric acid to adjust pH level to be about pH 2, and 5 g of CaO powder, followed by stirring for more than 3 hours, thereby preparing a sol-state mixture.

The sol-state mixture was coated on a soda glass substrate, spin-coated at 180 rpm for 120 second, and dried at a drying oven for about 2 minutes for removing unevaporated solvent. The resultant product was subjected to heat treatment at about 250° C. for 30 minutes, thereby forming a transparent nanoporous CaO film having a thickness of 3.5 μm.

A sealant was coated on at least one side of the soda glass substrate having the transparent nanoporous CaO film and at least one side of a glass substrate having a first electrode, an organic layer and a second electrode. Next, the two substrates were adhered to each other, thereby completing an organic electroluminescence device.

The transparent nanoporous CaO film prepared in Example 1 had a refractive index of 1.3-1.5 and porosity of 50-70%, suggesting that the film had excellent film properties. In order to examine micro structure of the resulting layer, a scanning electron microscope (SEM) was used, and the results thereof are shown in FIGS. 3A and 3B.

Figure 3A:
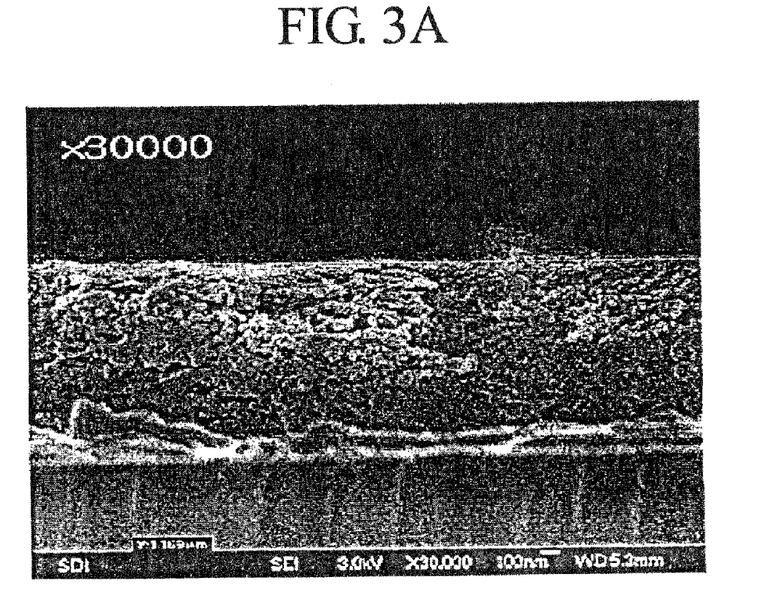
FIG. 3A is a scanning electron microscope (SEM) photograph illustrating a cross section of a transparent nanoporous CaO film prepared in Example 1 of the present invention.
Figure 3B:
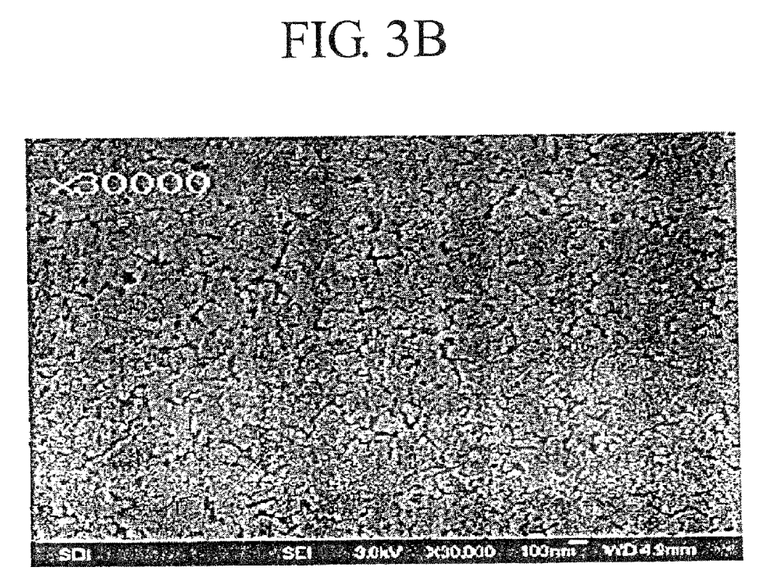
FIG. 3B is an SEM photograph illustrating a surface of the transparent nanoporous CaO film prepared in Example 1 of the present invention.

Referring to FIGS. 3A and 3B, the product layer was a clean, defectless coating without cracks. Also, nano-sized pores were formed between each of the respective particles.

Figure 4:
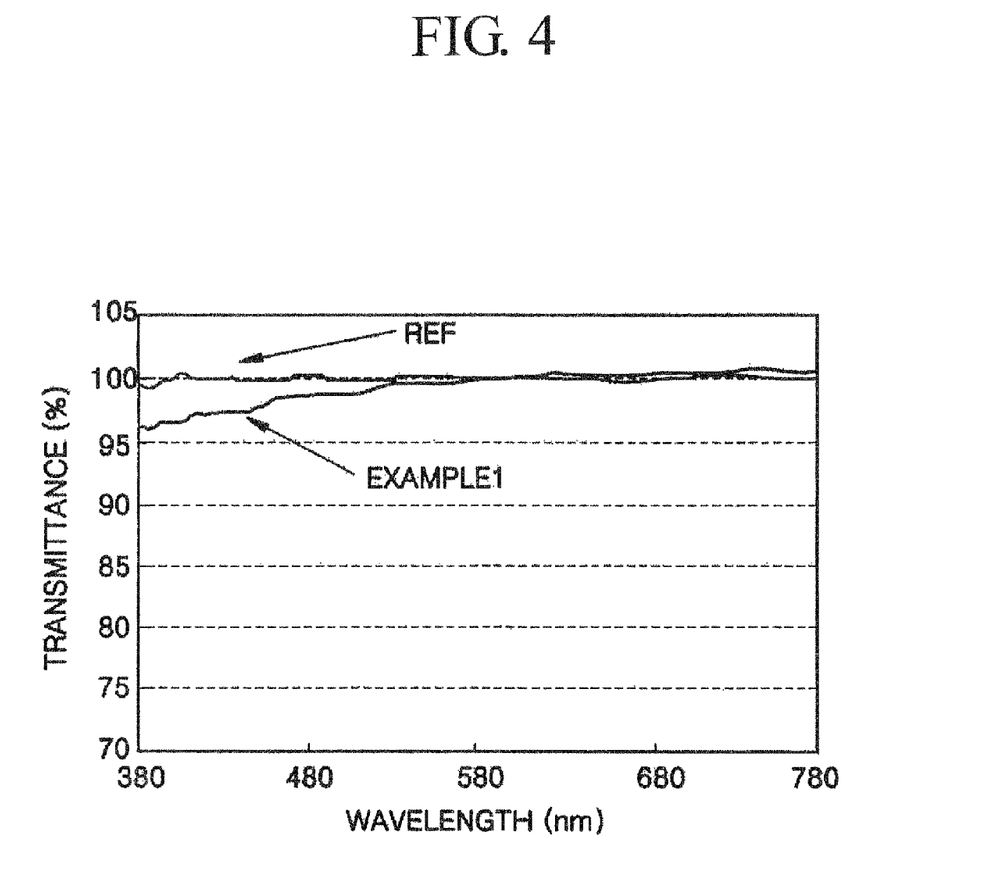
FIG. 4 is a graphical representation of film transmittance at visible light in the organic electroluminescence device manufactured in Example 1 of the present invention.

The organic electroluminescence device manufactured in Example 1 was tested for transmittance with visible light, and the results are shown in FIG. 4, together with evaluation data for a glass substrate of the same kind without coating the transparent nanoporous oxide layer by reference.

Referring to FIG. 4, transparent films were obtained over the entire region of visible light.

EXAMPLE 2

To 95 g of ethanol was added nitric acid to adjust pH level to be about pH 2, and 5 g of CaO powder, followed by stirring for more than 3 hours. 1 g (30% by weight) of water-soluble acryl resin solution was added to the resulting mixture and stirred, giving a homogenized solution.

The resulting solution was coated on the soda glass substrate, spin-coated at 180 rpm for 120 seconds, and dried at an evaporating oven for about 2 minutes for removing unevaporated solvent. The resultant product was subjected to heat treatment, thereby forming a transparent nanoporous CaO film.

A sealant was coated on at least one side of the soda glass substrate having the transparent nanoporous CaO film and at least one side of a glass substrate having a first electrode, an organic layer and a second electrode. Next, the two substrates were adhered to each other, thereby completing an organic electroluminescence device.

EXAMPLE 3

An organic electroluminescence device was manufactured in the same manner as in Example 1 except that spray coating, instead of spin coating, was used in the coating of the sol-state mixture.

Since a patterned coating is employed to each cell in the course of practically manufacturing organic electroluminescence devices, a film having a desired pattern can be easily obtained by employing a patterning mask in the spray coating.

COMPARATIVE EXAMPLE 1

An organic electroluminescence device was manufactured in the same manner as in Example 1 except that a transparent nanoporous CaO film was not formed on the soda glass substrate.

COMPARATIVE EXAMPLE 2

A common getter (HD-$SO_4$ manufactured by Dynic Co., Japan) was placed on a soda glass substrate, and a sealant was coated on at least one side of the soda glass substrate having the transparent nanoporous CaO film and at least one side of a glass substrate having a first electrode, an organic layer and a second electrode. Next, the two substrates were adhered to each other, thereby completing an organic electroluminescence device.

In order to evaluate lifetime characteristics of the organic electroluminescence devices manufactured in Example 1 and Comparative Examples 1 and 2, the devices were stored at 70° C. with a relative humidity of 90% and a change in the display screen state of each device was monitored over time using a microscope. The results are shown in FIGS. 5A and 5B.

Figure 5A:
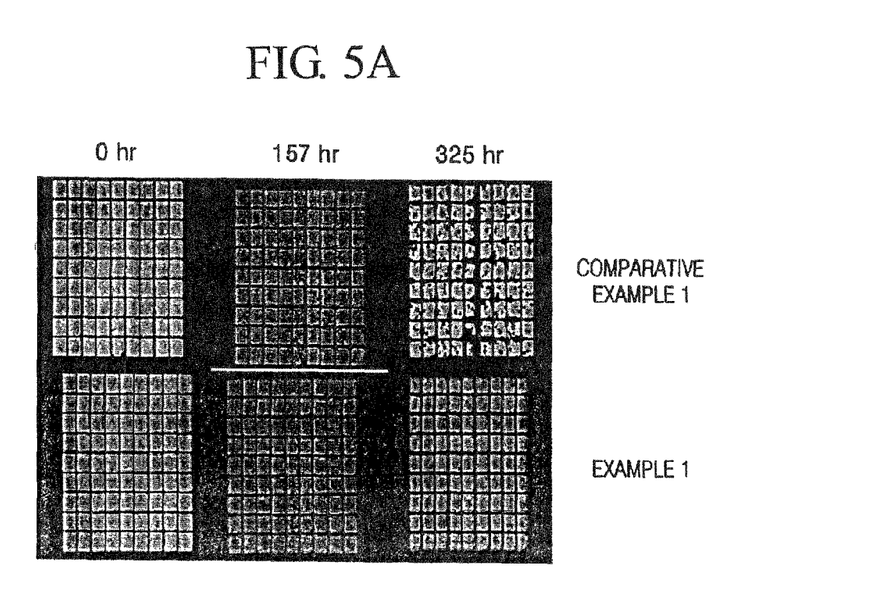
FIG. 5A shows comparison results of lifetimes between the organic electroluminescence devices manufactured in Example 1 of the present invention and Comparative Example 1.
Figure 5B:
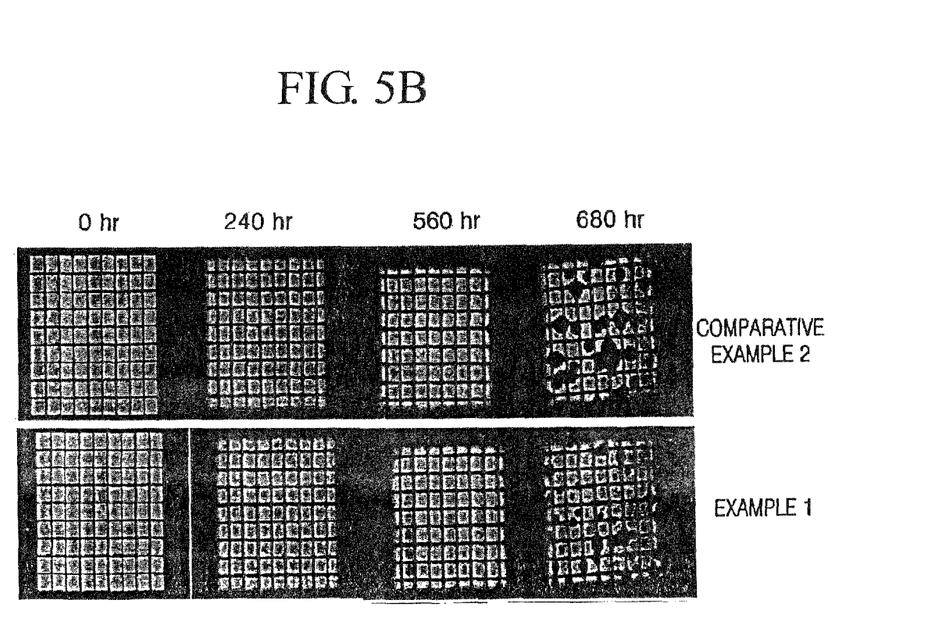
FIG. 5B shows comparison results of lifetimes of the organic electroluminescence devices manufactured in Example 1 of the present invention and Comparative Example 2.

Referring to FIG. 5A, the organic electroluminescence device manufactured in Example 1 exhibited noticeable improvement in lifetime compared to that manufactured in Comparative Example 1. As shown in FIG. 5B, in the organic electroluminescence device manufactured in Comparative Example 2 in which a getter was installed, since dark spots started to occur to the screen after 240 hours, the dark spots gradually grew over time. In the organic electroluminescence device manufactured in Example 1, on the other hand, no dark spot was found even after 560 hours. From these observation results, it was confirmed that the organic electroluminescence device manufactured in Example 1 showed improvement in lifetime compared to that manufactured in Comparative Example 2.

Also, the organic electroluminescence devices manufactured in Example 1 and Comparative Example 2 were stored at 70° C. with a relative humidity of 90% and a change in the luminance of each device was evaluated over time. The evaluation results are shown in FIG. 6.

Figure 6:
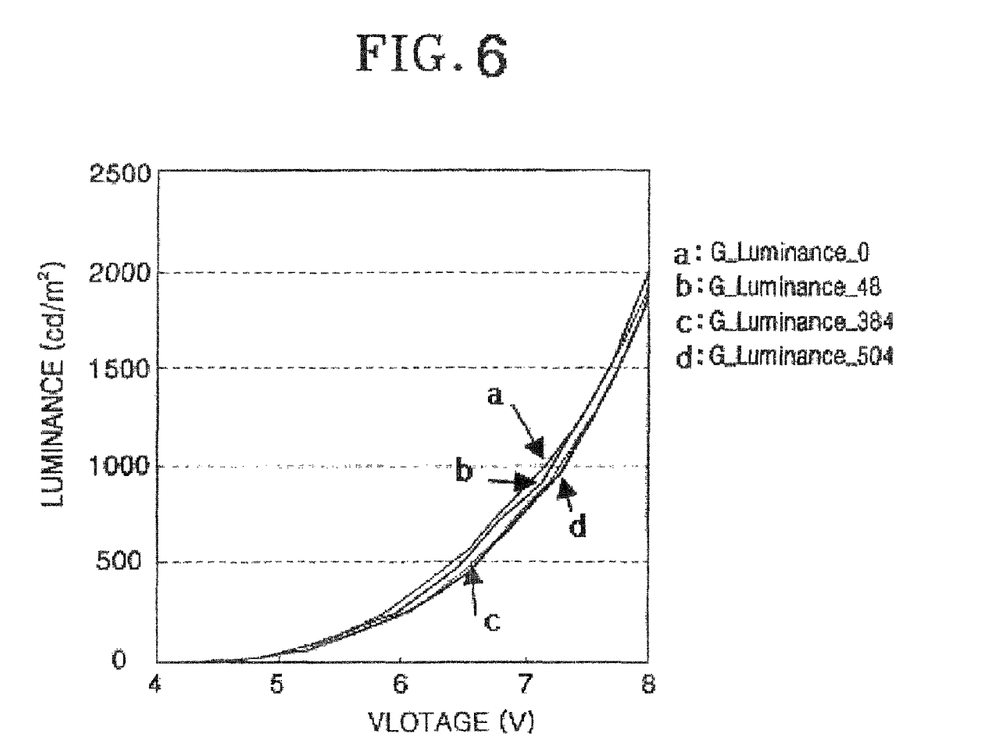
FIG. 6 shows a change in the luminance characteristics, of the organic electroluminescence devices manufactured in Example 1 of the present invention and Comparative Example 2, the luminance of each device measured after being stored at 70° C. and a relative humidity of 90%.

Referring to FIG. 6, after 560 hours, both the organic electroluminescence devices manufactured in Example 1 and Comparative Example 2 showed a luminance change of about 15% compared to the initial luminance. In FIG. 6, G_Luminance_0 indicates a luminance change ratio (initial luminance) for the organic electroluminescence device manufactured in Comparative Example 2, and G_Luminance_48, G_Luminance_384, and G_Luminance_504 indicate luminance change ratios for the organic electroluminescence device manufactured in Example 1 after an elapsed time of 48 hours, 384 hours, and 504 hours, respectively.

According to the present invention, a front emission type organic electroluminescence device which has improved lifetime by enhanced moisture and oxygen absorbing properties and ensured transparency by using a transparent nanoporous oxide layer having nano-sized porous oxide particles and pores, compared to the conventional case of using a getter. As described above, the transparent nanoporous oxide layer according to the present invention has good moisture and oxygen absorbing properties, so that it can improve lifetime of the device. Unetched flat glass can be used as an encapsulating member, instead of etched glass requiring additional process. Thus, structural weakness arising due to the use of etched glass can be overcome.

What is claimed is:

1. A method of manufacturing an organic electroluminescence device, comprising:
    preparing a front substrate and a rear substrate having an organic electroluminescence element comprising a first electrode, an organic layer and a second electrode;
    forming a transparent nanoporous oxide layer in an internal space formed by the rear substrate and the front substrate, wherein the step of forming the transparent nanoporous oxide layer comprises dispersing nanoporous oxide particles in a solvent and optionally acid to give a sol-state composition, coating the sol-state composition, and drying and heat-treating the coated composition;
    applying a sealant on a peripheral portion of the organic electroluminescence element of at least one of the rear substrate and the front substrate; and
    coupling the rear substrate and the front substrate to each other via the sealant to seal said internal space.

2. The method of claim 1, wherein the heat-treatment is performed at a temperature of not greater than 250 ° C.

3. The method of claim 1, wherein the step of dispersing the nanoporous oxide particles in the solvent and optionally the acid comprises adjusting pH to about 1 to about 8 by adding the solvent and optionally the acid, and adding the nanoporous oxide particles to the solvent.

4. The method of claim 1, wherein the solvent is at least one selected from the group consisting of ethanol, methanol, propanol, butanol, isopropanol. methylethylketone, pure water, propyleneglycol (mono)methylether (PGM), isopropylcellulose (IPC), methylene chloride (MC), and ethylene carbonate (EC).

5. The method of claim 1, wherein the acid is at least one selected from the group consisting of nitric acid, hydrochloric acid, sulfuric acid and acetic acid.

6. The method of claim 1, wherein the solvent is used in an amount of 60 to 99 parts by weight based on 100 parts by weight of the nanoporous oxide particles.

7. The method of claim 1, wherein the solvent is used in an amount of 60 to 99 parts by weight and the acid in an amount of 0.01 to 0.1 parts by weight, based on 100 parts by weight of the nanoporous oxide particles.

8. The method of claim 1, wherein the nanoporous oxide particles are of at least one kind selected from the group consisting of alkali metal oxide, alkali earth metal oxide, metal halide, metal sulfate and metal perchlorate.

9. The method of claim 8, wherein the nanoporous oxide particles are at least one selected from the group consisting of lithium oxide ($Li_2O$), sodium oxide ($Na_2O$), potassium oxide ($K_2O$), barium oxide (BaO), calcium oxide (CaO), magnesium oxide (MgO), lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), nickel sulfate ($NiSO_4$), calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cerium bromide ($CeBr_4$), selenium bromide ($SeBr_2$), vanadium bromide ($VBr_2$), magnesium bromide ($MgBr_2$), barium iodide ($BaI_2$), magnesium iodide ($MgI_2$), barium perchlorate ($Ba(ClO_4)_2$), and magnesium perchlorate ($Mg(ClO_4)_2$).

10. An organic electroluminescence (EL) device manufactured by the method of claim 9, comprising:
    the rear substrate;
    the organic electroluminescence element formed on the rear substrate, said organic electroluminescence element comprising the first electrode, the organic layer and the second electrode;
    the front substrate being coupled to the rear substrate via the sealant applied to the peripheral portion, sealing an internal space in which the organic electroluminescence element is accommodated; and
    the transparent porous oxide layer formed on one of said front substrate, said rear substrate and said sealant to absorb moisture in said internal space, said transparent porous oxide layer maintaining a transparent state before and after absorbing moisture.

11. The method of claim 1, wherein the nanoporous oxide particles have an average particle diameter of not greater than 100 nm.

12. The method of claim 1, wherein the nanoporous oxide particles have an average particle diameter of 20 nm to 100 nm.

13. The method of claim 1, wherein the transparent nanoporous oxide layer is made of calcium oxide (CaO).

14. The method of claim 1, wherein the front substrate comprises glass or plastic.

15. The method of claim 1, wherein the front substrate comprises plastic and a protection layer to protect the front substrate.

16. The method of claim 1, further comprising one of the step of vacuuming the internal space and the step of filling the internal space with inert gas.

17. The method of claim 1, wherein the transparent porous oxide layer is formed on the inner surface of the front substrate.

18. The method of claim 1, wherein the transparent porous oxide layer is formed on the sealant.

19. The method of claim 1, wherein one of the rear substrate and the front substrate has a recess in which the transparent porous oxide layer is formed.

20. The method of claim 1, wherein the step of coating the sol-state composition is performed by a method selected from the group consisting of spin coating, spray coating, deep coating, dispensing, and printing.

21. The method of claim 1, wherein the step of coating the sol-state composition is performed by spray coating.

22. The method of claim 1, wherein the front substrate is unetched flat glass.

23. The method of claim 1, wherein the nanoporous oxide particles are dispersed in the solvent by using electrostatic repulsion.

24. An organic electroluminescence device manufactured by the method of claim 1.

* * * * *